(12) United States Patent
Liao et al.

(10) Patent No.: US 12,362,231 B2
(45) Date of Patent: Jul. 15, 2025

(54) SELF-ASSEMBLED DIELECTRIC ON METAL RIE LINES TO INCREASE RELIABILITY

(71) Applicant: Taiwan Semiconductor Manufacturing Company, Ltd., Hsinchu (TW)

(72) Inventors: Wei-Hao Liao, Taichung (TW); Hsi-Wen Tien, Xinfeng Township (TW); Chih Wei Lu, Hsinchu (TW); Yu-Teng Dai, New Taipei (TW); Hsin-Chieh Yao, Hsinchu (TW); Chung-Ju Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 5 days.

(21) Appl. No.: 18/359,030

(22) Filed: Jul. 26, 2023

(65) Prior Publication Data

US 2023/0369108 A1 Nov. 16, 2023

Related U.S. Application Data

(62) Division of application No. 17/337,753, filed on Jun. 3, 2021, now Pat. No. 11,798,840.

(51) Int. Cl.
*H01L 21/768* (2006.01)
*H01L 23/522* (2006.01)

(52) U.S. Cl.
CPC .. *H01L 21/76831* (2013.01); *H01L 21/76832* (2013.01); *H01L 23/5226* (2013.01)

(58) Field of Classification Search
CPC ............... H01L 21/76898; H01L 24/16; H01L 2224/02372; H01L 2224/05124; H01L 2224/05147; H01L 2225/06541; H01L 2924/01013; H01L 2924/01029; H01L 2924/14; H01L 24/02; H01L 24/03; H01L 24/05
See application file for complete search history.

(56) References Cited

U.S. PATENT DOCUMENTS

| | | | |
|---|---|---|---|
| 6,333,260 B1 * | 12/2001 | Kwon | H01L 21/76802 438/597 |
| 2002/0158339 A1 | 10/2002 | Yamamoto | |
| 2021/0098292 A1 * | 4/2021 | Nguyen | H01L 21/02126 |

OTHER PUBLICATIONS

Notice of Allowance dated Jun. 22, 2023 for U.S. Appl. No. 17/337,753.

* cited by examiner

*Primary Examiner* — Thanhha S Pham
(74) *Attorney, Agent, or Firm* — Eschweiler & Potashnik, LLC

(57) ABSTRACT

Some embodiments of the present disclosure relate to a semiconductor structure including a first conductive wire disposed over a substrate. A dielectric liner is arranged along sidewalls and an upper surface of the first conductive wire and is laterally surrounded by a first dielectric layer. The dielectric liner and the first dielectric layer are different materials. A conductive via is disposed within a second dielectric layer over the first conductive wire. The conductive via has a first lower surface disposed over the first dielectric layer and a second lower surface below the first lower surface and over the first conductive wire.

20 Claims, 12 Drawing Sheets

SELF-ASSEMBLED DIELECTRIC ON METAL RIE LINES TO INCREASE RELIABILITY

REFERENCE TO RELATED APPLICATION

This Application is a Divisional of U.S. application Ser. No. 17/337,753, filed on Jun. 3, 2021, the contents of which are hereby incorporated by reference in their entirety.

BACKGROUND

As dimensions and feature sizes of semiconductor integrated circuits (ICs) are scaled down, the density of the elements forming the ICs is increased and the spacing between elements is reduced. Such spacing reductions are limited by light diffraction of photolithography, mask alignment, isolation and device performance among other factors. As the distance between any two adjacent conductive features decreases, the complexity of fabrication increases and the risk of fabrication errors increases. The operating voltage of ICs do not scale at the same pace as feature sizes decrease, resulting in increasing electric fields inside devices. Capacitance typically increases, which results in an increase in power consumption and time delay leading to degradation of device performance.

DETAILED DESCRIPTION

Figure 1:
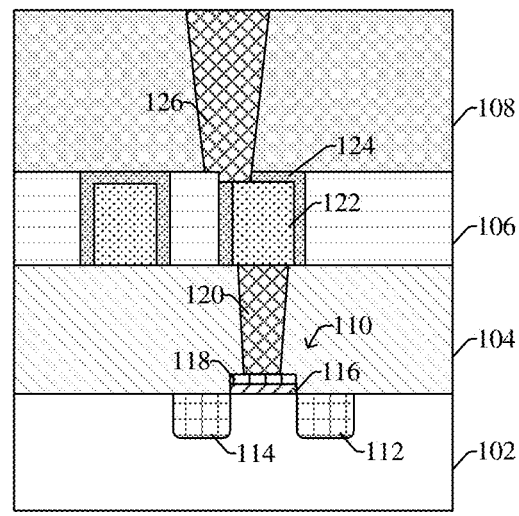
FIG. 1 illustrates a cross-sectional view of some embodiments of an integrated chip having self-assembled dielectric liners overlying conductive wires that are disposed above an inter-level dielectric (ILD) layer with a second conductive via above the conductive wire with a registration error.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

ICs may include a number of semiconductor devices (e.g., transistors, memory devices, etc.) disposed over and/or within a semiconductor substrate. An interconnect structure may be disposed over the semiconductor substrate. The interconnect structure may include conductive features (e.g., conductive wires and conductive vias) disposed within an inter-level dielectric (ILD) structure. During some fabrication processes, including metal reactive-ion etching (RIE), conductive features disposed within an interconnect structure may be exposed to fluorine etchants that can damage the conductive features. Furthermore, registration errors (i.e., overlay errors) during fabrication can result in shifted conductive features (e.g., conductive vias and/or conductive wires). Shifted conductive features can encroach on unintended areas between interconnect structures.

As a result of conductive features exposed to fluorine etchants, and unintended shifted conductive features, the reliability of ICs can be compromised. For example, the capacitance and/or electric fields between adjacent conductive features can be increased. Furthermore, a risk of time dependent dielectric breakdown (TDDB) failures may also increase due to intrinsic breakdown of dielectric materials between adjacent conductive wires and/or conductive vias, leading to integrated chip failure.

Various embodiments of the present disclosure are directed towards ICs with interconnect structures that include a self-assembled dielectric disposed on conductive features and configured to reduce registration errors (e.g., overlay errors) between adjacent conductive features. For example, in some embodiments, after performing a metal RIE to define conductive features, a self-assembled dielectric liner can be selectively deposited on the conductive features. An inter-level dielectric (ILD) layer can be deposited above the self-assembled dielectric liner, and subsequently etched to accommodate a conductive interconnect structure. As the self-assembled dielectric liner overlies the conductive features, during etching of the ILD layer, the conductive features are protected from etchants that may include fluorine that can degrade the conductive features. Furthermore, the self-assembled dielectric can comprise a different etching rate relative to the surrounding ILD layer. As a result, if a registration error occurs during fabrication, resulting in a shifted or misaligned subsequent interconnect layer, the self-assembled dielectric can minimize or eliminate unintended over-etching of the ILD layer between conductive features, and thereby reduce capacitance, electric field strength, and/or the risk of TDDB between the conductive features.

FIG. 1 illustrates a cross-sectional view of some embodiments of an integrated chip 100 having a plurality of self-assembled dielectric liners 124 overlying a plurality of conductive wires 122.

The integrated chip 100 includes a semiconductor device 110 disposed within a substrate 102. In some embodiments, the semiconductor device 110 comprises source/drain regions 112, 114 disposed within the substrate 102. The semiconductor device 110 may further comprise a gate dielectric layer 116 above the substrate 102 and between the source/drain regions 112, 114 and a gate electrode 118 overlying the gate dielectric layer 116. The gate dielectric layer 116 and gate electrode 118 are disposed within a first inter-level dielectric (ILD) layer 104. A first conductive via 120 extends from the gate electrode 118 to a top of the first ILD layer 104.

A plurality of conductive wires 122 are disposed above the first ILD layer 104 and within a second ILD layer 106. In some embodiments, the plurality of conductive wires 122 may be laterally offset from one another. In some embodiments, one or more of the plurality of conductive wires 122 also overlie and electrically couple to the first conductive via 120.

A plurality of self-assembled dielectric liners 124 are arranged along sidewalls and upper surfaces of the plurality of conductive wires 122. The plurality of self-assembled dielectric liners 124 may be arranged on the plurality of conductive wires 122. The plurality of self-assembled dielectric liners 124 are laterally surrounded by the second ILD layer 106 and extend from a bottom surface of the second ILD layer 106 to a top surface of the second ILD layer 106. A third ILD layer 108 is disposed above the second ILD layer 106.

One or more second conductive vias 126 are disposed within the third ILD layer 108. The one or more second conductive vias 126 extend from a top surface of the third ILD layer 108 to below a bottom surface of the third ILD layer 108 and below the top surface of the second ILD layer 106. The one or more second conductive vias 126 contact the plurality of self-assembled dielectric liners 124 and are electrically coupled to an underlying one of the plurality of conductive wires 122. In some embodiments, the one or more second conductive vias 126 may laterally straddle an outer edge of the underlying one of the plurality of conductive wires 122 due to a registration error (e.g., overlay error).

In some embodiments, the one or more second conductive vias 126 respectively have a first and second lower surface, creating a stair step pattern from the top surface of the second ILD layer 106 to a top surface of the underlying one of the plurality of conductive wires 122. The first lower surface of the one or more second conductive vias 126 overlies the top surface of the second ILD layer 106 and the second lower surface of the one or more second conductive vias 126 overlies the top surface of the underlying one of the plurality of conductive wires 122. In some embodiments, the second lower surface of the one or more second conductive vias 126 also overlies an upper surface of an underlying one of the plurality of self-assembled dielectric liners 124. A first sidewall of the one or more second conductive vias 126 is arranged along a sidewall of the underlying one of the plurality of self-assembled dielectric liners 124 between the top surface of the plurality of conductive wires 122 and the third ILD layer 108. A second sidewall of the one or more second conductive vias 126 is arranged along a sidewall of the second ILD layer 106.

Because the plurality of self-assembled dielectric liners 124 cover the plurality of conductive wires 122, the plurality of self-assembled dielectric liners 124 are able to protect the plurality of conductive wires 122 from an etchant (e.g., having a fluorine etching chemistry) used to form a via hole within the third ILD layer 108 during fabrication of the second conductive via 126. Furthermore, the plurality of self-assembled dielectric liners 124 comprise a material having a different removal rate (e.g., etching rate) than the surrounding second ILD layer 106. As a result, the plurality of self-assembled dielectric liners 124 may be removed at a faster rate than the second ILD layer 106, and adverse effects from registration errors (e.g., overlay errors) can be minimized. This is because when a misaligned via hole reaches a bottom of the third ILD layer 108, it will expose upper surfaces of both the plurality of self-assembled dielectric liners 124 and the second ILD layer 106. Removing the plurality of self-assembled dielectric liners 124 faster than the second ILD layer 106 provides a good electrical connection between the one or more second conductive vias 126 and the plurality of conductive wires 122 without significantly damaging the second ILD layer 106, thereby mitigating TDDB failures and improving reliability.

Figure 2A:
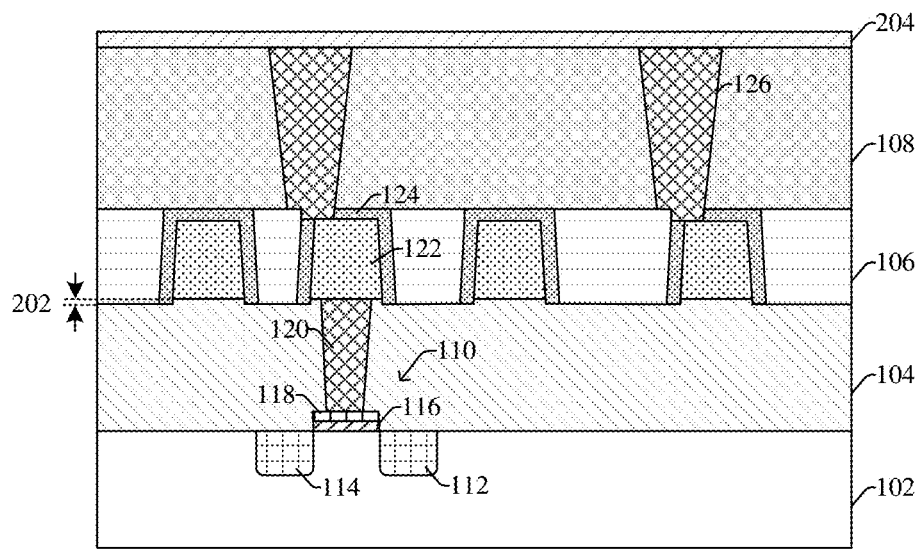
FIG. 2A illustrates a cross-sectional view of some embodiments of an integrated chip having a plurality of self-assembled dielectric liners overlying a plurality of conductive wires that are disposed above an inter-level dielectric (ILD) layer with a plurality of second conductive vias above the conductive wires with a registration error.

FIG. 2A illustrates a cross-sectional view of some embodiments of an integrated chip 200a having a plurality of self-assembled dielectric liners 124 overlying a plurality of conductive wires 122 that are disposed above a first ILD layer 104 with one or more second conductive vias 126 above the plurality of conductive wires 122 with a registration error.

The integrated chip 200a includes a semiconductor device 110 comprising source/drain regions 112, 114 disposed within a substrate 102. In some embodiments, the substrate 102 may, for example, be or comprise a bulk semiconductor substrate (e.g., bulk silicon), a silicon-on-insulator (SOI) substrate, or another suitable substrate material. The semiconductor device 110 further comprises a gate dielectric layer 116 and a gate electrode 118 disposed within the first ILD layer 104. A first conductive via 120 extends from the gate electrode 118 to the top of the first ILD layer 104. In some embodiments, the first ILD layer 104 may, for example, be or comprise silicon dioxide (e.g., $SiO_2$), a low-k dielectric material, an extreme low-k dielectric material, or the like.

A plurality of conductive wires 122 are disposed above the first ILD layer 104 and within a second ILD layer 106. The plurality of conductive wires 122 are laterally offset from one another. In some embodiments, the first ILD layer 104 may have a recessed upper surface between adjacent ones of the plurality of conductive wires 122. In some embodiments, the recessed upper surface may be recessed a non-zero distance 202 below upper surfaces of the first ILD layer 104 that are directly below the plurality of conductive wires 122. In some such embodiments, the second ILD layer 106 may vertically extend below bottoms of the plurality of conductive wires 122. In some embodiments, the plurality of conductive wires 122 have angled sidewalls that cause a width of respective ones of the plurality of conductive wires 122 to decrease as a height over the first ILD layer 104 increases.

In some embodiment, one or more of the plurality of conductive wires 122 can overlie and electrically couple to other conductive interconnect structures. For example, one of the plurality of conductive wires 122 can overlie and electrically couple to the first conductive via 120. In some embodiments, the plurality of conductive wires 122 may, for example, be or comprise molybdenum (Mo), osmium (Os), iridium (Ir), cobolt (Co), niobium (Nb), platinum (Pt), rhodium (Rh), rhenium (Re), copper (Cu), tungsten (W), chromium (Cr), ruthenium (Ru), vanadium (V), lead (Pd), or the like. In some embodiments, the second ILD layer 106 may, for example, be or comprise a dielectric material with a dielectric constant less than 3.9.

A plurality of self-assembled dielectric liners 124 are arranged along sidewalls and an upper surface of the plurality of conductive wires 122. In some embodiments, the plurality of self-assembled dielectric liners 124 may be arranged on the plurality of conductive wires 122. The plurality of self-assembled dielectric liners 124 are laterally surrounded by a second ILD layer 106 and extend from a bottom surface of the second ILD layer 106 to a top surface of the second ILD layer 106. In some embodiments, the plurality of self-assembled dielectric liners 124 may, for example, be or comprise silicone oxide (SiOx), silicon oxycarbide (SiOC), silicon oxycarbonitride (SiOCN), silicon carbon nitride (SiCN), silicon oxynitride (SiON), silicon carbide (SiC), or silicon nitride (SiN), or the like.

A third ILD layer 108 is disposed above the second ILD layer 106. In some embodiments, the third ILD layer 108 may, for example, be or comprise a dielectric material with a dielectric constant less than 3.9. One or more second conductive vias 126 are disposed within the third ILD layer 108. In some embodiments, the one or more second conductive vias 126 may comprise a plurality of conductive vias. The one or more second conductive vias 126 extend from a top surface of the third ILD layer 108 to below a bottom surface of the third ILD layer 108 and below the top surface of the second ILD layer 106. In further embodiments, the first conductive via 120, and the one or more second conductive vias 126 may, for example, respectively be or comprise copper (Cu), ruthenium (Ru), tungsten (W), cobalt (Co), titanium (Ti), aluminum (Al) titanium nitride (TiN), tantalum (Ta), tantalum nitride (TaN), or the like.

The one or more second conductive vias 126 contact one or more of the plurality of self-assembled dielectric liners 124 and electrically couple to an underlying one of the plurality of conductive wires 122 with a registration error (e.g., overlay error). The one or more second conductive vias 126 have a first and second lower surface, creating a stair step pattern from the top surface of the second ILD layer 106 to a top surface of the underlying one of the plurality of conductive wires 122. The first lower surface of the one or more second conductive vias 126 overlies the top surface of the second ILD layer 106 and the second lower surface of the one or more second conductive vias 126 overlies the top surface of the underlying one of the plurality of conductive wires 122. In some embodiments, the second lower surface of the one or more second conductive vias 126 also overlies an upper surface of an underlying one of the plurality of self-assembled dielectric liners 124. A first sidewall of the one or more second conductive vias 126 is arranged along a sidewall of the underlying one of the plurality of self-assembled dielectric liners 124 between the top surface of the one or more plurality of conductive wires 122 and the third ILD layer 108. A second sidewall of the one or more second conductive vias 126 is arranged along a sidewall of the second ILD layer 106.

In some embodiments, an etch stop layer 204 is disposed above the third ILD layer 108. In some embodiments, the etch stop layer 204 may, for example, be or comprise a nitride (e.g., silicon nitride), a carbide (e.g., silicon carbide), or the like. In some embodiments, an overlying interconnect (not shown) may extend through the etch stop layer 204 to contact one of the one or more second conductive vias 126.

Figure 2B:
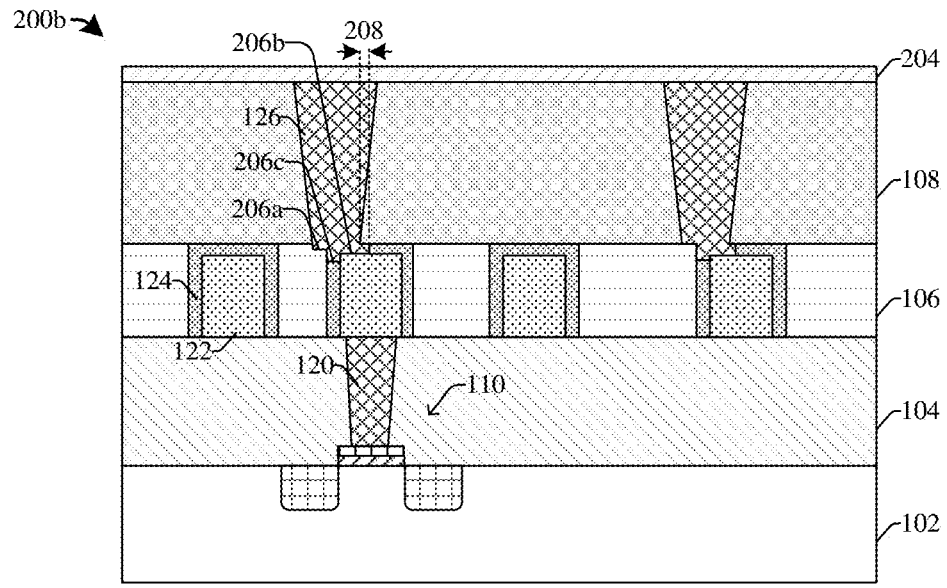
FIGS. 2B and 2C illustrates a cross-sectional view of some embodiments of an integrated chip having a plurality of self-assembled dielectric liners overlying a plurality of conductive wires that are disposed above an inter-level dielectric (ILD) layer with a plurality of second conductive vias above the plurality of conductive wires with a registration error where one or more of the plurality of conductive wires have an alternative bottom surface.

FIG. 2B illustrates a cross-sectional view of some alternative embodiments of an integrated chip 200b having a plurality of self-assembled dielectric liners 124 overlying a plurality of conductive wires 122.

The integrated chip 200b includes a plurality of conductive wires 122 disposed within a second ILD layer 106 over a substrate 102. One or more second conductive vias 126 extend from a top surface of a third ILD layer 108 to below a bottom surface of the third ILD layer 108 and below the top surface of the second ILD layer 106. The one or more second conductive vias 126 contact a plurality of self-assembled dielectric liners 124 surrounding the plurality of conductive wires 122 and are electrically coupled to an underlying one of the plurality of conductive wires 122 with a registration error (e.g., overlay error).

In some embodiments, the one or more second conductive vias 126 comprise a first, a second, and a third lower surface 206a, 206b, and 206c respectively. The first lower surface 206a is below a top surface of the second ILD layer 106 laterally offset from the plurality of self-assembled dielectric liners 124 and above a top surface of an underlying one of the plurality of conductive wires 122. The second lower surface 206b overlies a top surface of the underlying one of the plurality of conductive wires 122, and is below the first lower surface 206a. The third lower surface 206c is below the first and second lower surfaces 206a, 206b, and overlies an upper surface of the plurality of self-assembled dielectric liners 124.

A first sidewall of the one or more second conductive vias 126 is arranged along a sidewall of the plurality of self-assembled dielectric liners 124 between the top surface of the underlying one of the plurality of conductive wires 122 and the third ILD layer 108. In some embodiments, the first sidewall may be laterally offset from a sidewall of the third ILD layer 108 by a non-zero distance 208. In other embodiments, the first sidewall may be substantially aligned with the sidewall of the third ILD layer 108 (not depicted). A second sidewall of the one or more second conductive vias 126 is arranged along a sidewall of the second ILD layer 106. A third sidewall of the one or more second conductive via 126 is arranged along a sidewall of the underlying one of plurality of conductive wires 122. The lower surfaces 206a, 206b, and 206c can occur as a result of etching of the second ILD layer 106 and the plurality of self-assembled dielectric liners 124 where the second ILD layer 106 and the plurality of self-assembled dielectric liners 124 have differing etch rates.

Figure 2C:
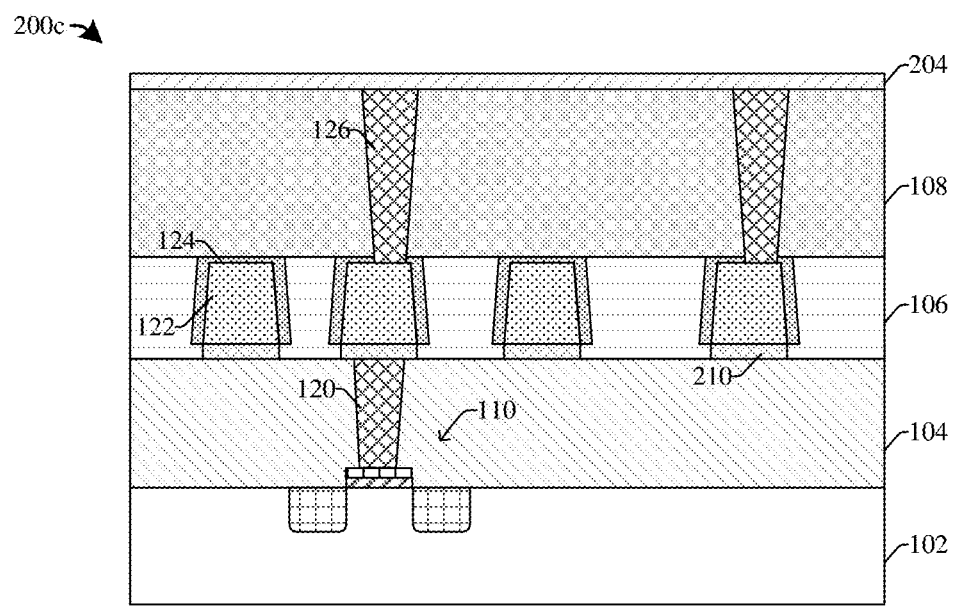

FIG. 2C illustrates a cross-sectional view of some alternative embodiments of an integrated chip 200c having a plurality of self-assembled dielectric liners 124 overlying a plurality of conductive wires 122. Integrated chip 200c shows several alternative embodiments relative to FIG. 2A and FIG. 2B. One or more of the alternative embodiments, or any combination thereof from integrated chip 200c can apply to integrated chips 200a and 200b.

Integrated chip 200c comprises a plurality of diffusion barriers 210 disposed above a first ILD layer 104 and within a second ILD layer 106. The plurality of diffusion barriers 210 are laterally offset from one another. In some embodiments, one or more of the plurality of diffusion barriers 210 can overlie and electrically couple to other conductive interconnect structures, for example, the first conductive via 120. In some embodiments, the plurality of diffusion barriers 210 may, for example, be or comprise titanium (Ti), titanium (TiN), tantalum (Ta), tantalum nitride (TaN), or the like.

A plurality of conductive wires 122 overlie and electrically couple to the plurality of diffusion barriers 210 within the second ILD layer 106. The plurality of conductive wires 122 are laterally offset from one another. The plurality of conductive wires 122 are defined by a trapezoidal shape where a top width of a top surface of the plurality of conductive wires 122 is less than a bottom width of a bottom surface of the plurality of conductive wires 122. Furthermore, bottom edges of the plurality of conductive wires 122 extend laterally to top edges of the plurality of diffusion barriers 210. In some embodiments, the plurality of diffusion barriers 210 may be configured to prevent diffusion of a diffusive species (e.g., copper and/or aluminum) from the plurality of conductive wires 122 to surrounding structures.

A plurality of self-assembled dielectric liners 124 are arranged along sidewalls and an upper surface of the plurality of conductive wires 122. The plurality of self-assembled dielectric liners 124 have uppermost edges and bottommost edges where the bottommost edges are further apart from one another than the uppermost edges. The plurality of self-assembled dielectric liners 124 are laterally surrounded by the second ILD layer 106 and extend from the bottom surface of the plurality of conductive wires 122 to a top surface of the second ILD layer 106. In some embodiments, a thickness of a horizontal component of the plurality of self-assembled dielectric liners 124 along sidewalls of the plurality of conductive wires 122 can be different (e.g., greater than) than a thickness of a vertical component of the plurality of self-assembled dielectric liners 124 directly over the plurality of conductive wires 122. In further embodiments, the plurality of self-assembled dielectric liners 124 extend from a bottom surface of the second ILD layer 106 to the top surface of the second ILD layer 106 (not depicted).

A third ILD layer 108 is disposed above the second ILD layer 106 and the plurality of self-assembled dielectric liners 124. One or more second conductive vias 126 are disposed within the third ILD layer 108. The one or more second conductive vias 126 extend from a top surface of the third ILD layer 108 to below a bottom surface of the third ILD layer 108 and below the top surface of the second ILD layer 106. The one or more second conductive vias 126 are of a trapezoidal shape where a top width of a top surface of the one or more second conductive vias 126 is greater than a bottom width of a bottom surface of the plurality of second conductive vias 126. Furthermore, the bottom surface of the one or more second conductive vias 126 is laterally between outermost edges of one or more of the plurality of conductive wires 122 and between outermost edges of one or more of the plurality of self-assembled dielectric liners 124.

The one or more second conductive vias 126 contact one or more of the plurality of self-assembled dielectric liners 124 and electrically couple to one or more of the plurality of conductive wires 122. In some embodiments, the one or more second conductive vias 126 may have outermost sidewalls that are completely confined over an underlying one of the plurality of conductive wires 122. In some embodiments, the one or more second conductive vias 126 may be formed without a substantial registration error (e.g., with approximately no overlay error).

FIGS. 3-14B illustrate cross-sectional views 300-1400b of some embodiments of a method of forming an integrated chip having a self-assembled dielectric liner overlying a conductive wire disposed within a low-k dielectric with a conductive via electrically coupled to the conductive wire with and without registration errors. Although the cross-sectional views 300-1400b shown in FIGS. 3-14B are described with reference to a method, it will be appreciated that the structures shown in FIGS. 3-14B are not limited to the method but rather may stand alone separate of the method. Furthermore, although FIGS. 3-14B are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part. Also, alternative embodiments depicted in FIGS. 2A-2C may be substituted for embodiments in FIGS. 3-14B although they may not be shown.

Figure 3:
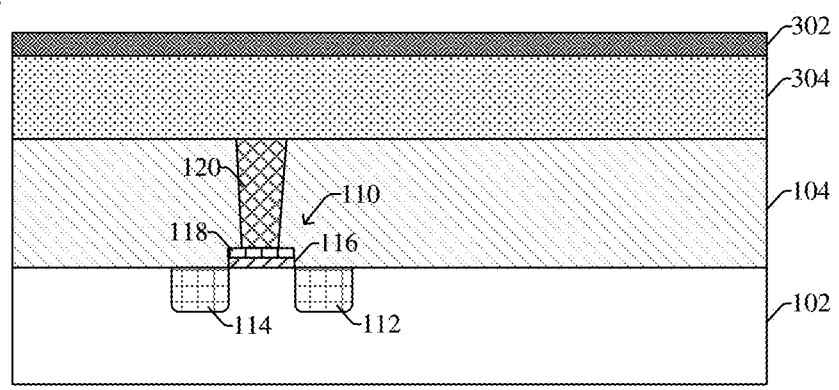
FIGS. 3-14B illustrate cross-sectional views of some embodiments of a method of forming an integrated chip having a self-assembled dielectric liner overlying a conductive wire disposed within a low-k dielectric with a conductive via electrically coupled to the conductive wire with and without registration errors.

As shown in cross-sectional view 300 of FIG. 3, a first conductive via 120 is formed over a semiconductor device 110 within a first ILD layer 104. The first conductive via 120 extends from the semiconductor device 110 to a top of the first ILD layer 104. In some embodiments, the first conductive via 120 may be directly electrically coupled to, and/or directly contact the semiconductor device 110 disposed within the first ILD layer 104. In some embodiments, the first conductive via 120 may be formed by a single damascene process.

In some embodiments, a single damascene process for forming the first conductive via 120 may include: depositing (e.g., by chemical vapor deposition (CVD), physical vapor deposition (PVD), atomic layer deposition (ALD), etc.) the first ILD layer 104 over a substrate 102. Then patterning the first ILD layer 104 to define a lower conductive feature opening within the first ILD layer 104. Then depositing (e.g., by PVD, CVD, ALD, etc.) a conductive material within the lower conductive feature opening, and performing a planarization process (e.g., a chemical mechanical planarization (CMP) process) into the conductive material.

A conductive layer 304 is deposited over the first ILD layer 104 and the first conductive via 120. In some embodiments the conductive layer 304 may, for example, be deposited by PVD, CVD or ALD. In some embodiments, the conductive layer 304 may be formed at a temperature of 10° to 400° Celsius, or another suitable growth or deposition process to a thickness ranging between 200 to 500 angstroms. A hard mask layer 302 is deposited over the conductive layer 304. In some embodiments, forming the hard mask layer 302 may include depositing a hard mask material over the conductive layer 304 and patterning the hard mask material to define the hard mask layer 302 with a plurality of sidewalls defining a plurality of openings (not shown) over the conductive layer 304. In further embodiments, the hard mask layer 302 may, for example, be or comprise titanium (Ti), tantalum (Ta), tantalum nitride (TaN), titanium nitride (TiN), aluminum (Al), another conductive material, or any combination of the foregoing by a PVD. CVD or ALD at a temperature of 10 to 400 Celsius, or another suitable growth or deposition process at a thickness of 80 to 150 angstroms.

Figure 4:
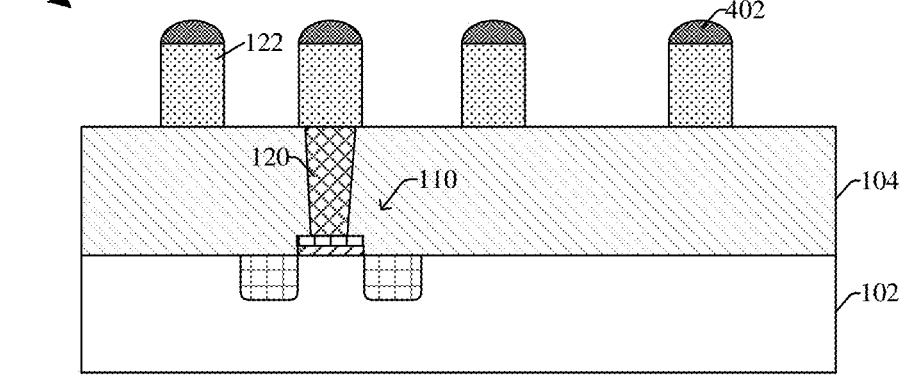

As shown in cross-sectional view 400 of FIG. 4, an etching process is performed on the conductive layer (304 of FIG. 3) according to the hard mask layer (302 of FIG. 3), thereby forming a plurality of conductive wires 122 and a plurality of residual hard masks 402 above the plurality of conductive wires 122. In some embodiments, the etching process includes performing a dry etch process such as a reactive-ion etching (RIE) process. In some such embodiments, the dry etching process can include a chlorine-based etchant. The plurality of conductive wires 122 are laterally separated from one another. In some embodiments, an etch rate of the conductive layer (304 of FIG. 3) is ten times faster or more than an etch rate of the hard mask layer (302 of FIG. 3) (i.e. hard mask layer 302 to conductive layer 304 etch selectivity of 10:1 or greater). In further embodiments, an etch rate of the first ILD layer 104 is eight times faster or more than the etch rate of the conductive layer (304 of FIG. 3) (i.e. conductive layer 304 to first ILD layer 104 etch selectivity of 8:1 or greater)

Figure 5:
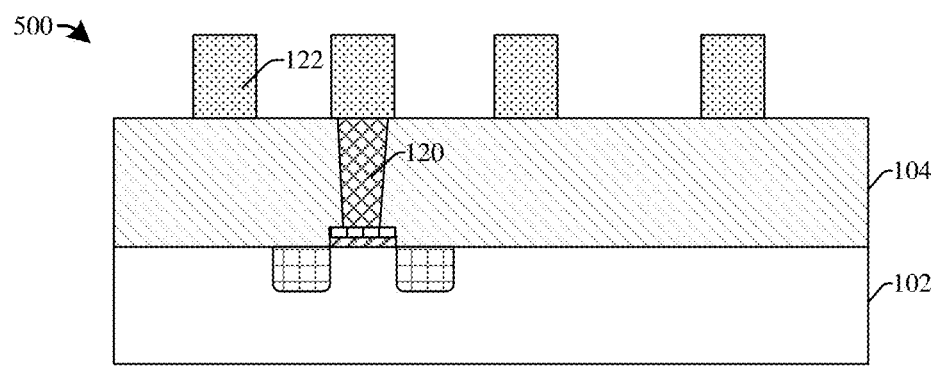

As shown in cross-sectional view 500 of FIG. 5, a wet removal process is performed to remove the plurality of residual hard mask (402 of FIG. 4) from above the plurality of conductive wires 210a. In some embodiments, the wet removal process may, for example, include exposing the residual hard mask (402 of FIG. 4) with hydrogen iodide (DI), hydrogen peroxide (H2O2), water (H2O), hydrofluoric acid (HF), di-hydrogen phosphate (H2PO4), hydrochloric acid (HCl), vinyl hydroperoxide (CH2CHOOH), sulfuric acid (H2SO4), nitric acid (HNO3), or another suitable cleaning agent. Each of the plurality of conductive wires 210a are defined by a pair of sidewalls in the vertical direction connected by a top surface in the horizontal direction.

Figure 6:
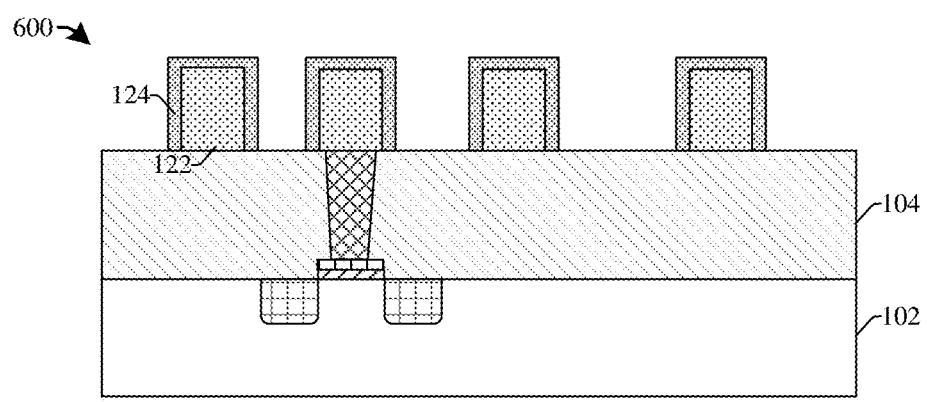

As shown in cross-sectional view 600 of FIG. 6, a plurality of self-assembled dielectric liners 124 are deposited on the plurality of conductive wires 122. The plurality of self-assembled dielectric liners 124 are deposited along the pair of sidewalls in the vertical direction and the top surface in the horizontal direction of the plurality of conductive wires 122.

In some embodiments, the plurality of self-assembled dielectric liners 124 may, for example, be deposited by PVD, CVD, ALD, plasma enhanced CVD (PECVD), or plasma enhanced ALD (PEALD) at a temperature of 180° to 350° Celsius, or another suitable growth or deposition process to a thickness of 20 to 100 angstroms. In further embodiments, the plurality of self-assembled dielectric liners 124 can be selectively deposited in a manner such that they form on the plurality of conductive wires 122. The selectively deposited plurality of self-assembled dielectric liners 124 undergo a material deposition process by which a metal surface of the plurality of conductive wires 122 reacts with a precursor of the plurality of self-assembled dielectric liners 124 forming physical absorption or chemical bonding with the metal surface. As such, the selectively deposited plurality of self-assembled dielectric liners 124 are self-assembled to the metal surface of the plurality of conductive wires 122.

Figure 7:
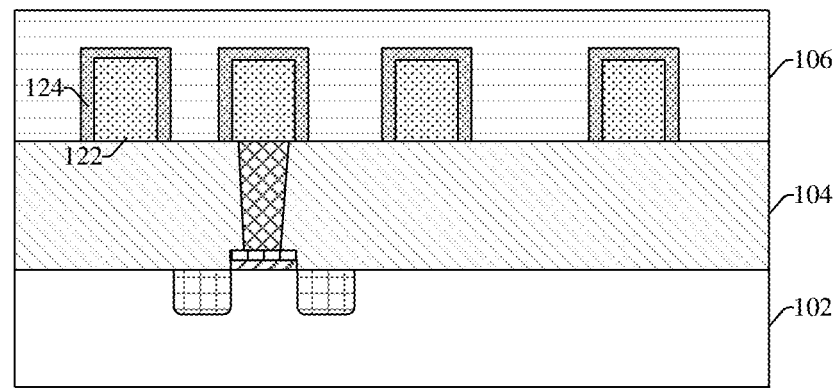

As shown in cross-sectional view 700 of FIG. 7, a second ILD layers 106 is deposited over the first ILD layer 104 and over/between the plurality of self-assembled dielectric liners 124. In some embodiments, the second ILD layer 106 may, for example, be formed by CVD, ALD, a spin coating, or another suitable deposition or growth process. In further embodiments, an etch rate of the plurality of self-assembled dielectric liners 124 is 10 times faster or more than an etch rate of the second ILD layer 106 (i.e. second ILD layer 106 to plurality of self-assembled dielectric liners 124 etch selectivity of 10:1 or greater)

Figure 8:
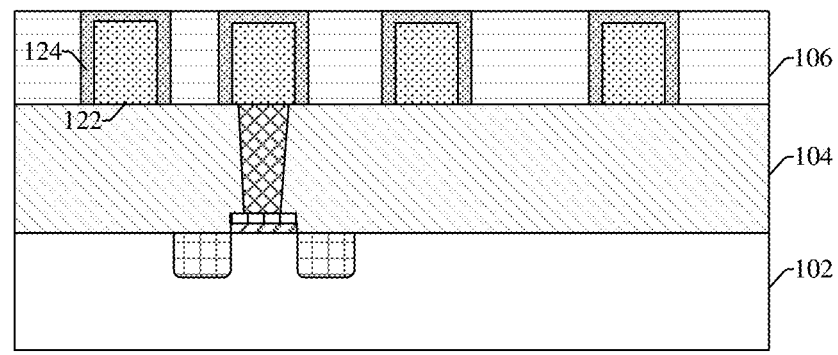

As shown in cross-sectional view 800 of FIG. 8, a planarization process (e.g., a CMP process) is performed into the second ILD layer 106. The planarization process causes the second ILD layer 106 to have a top surface that is substantially aligned with top surfaces of the plurality of self-assembled dielectric liners 124.

Figure 9:
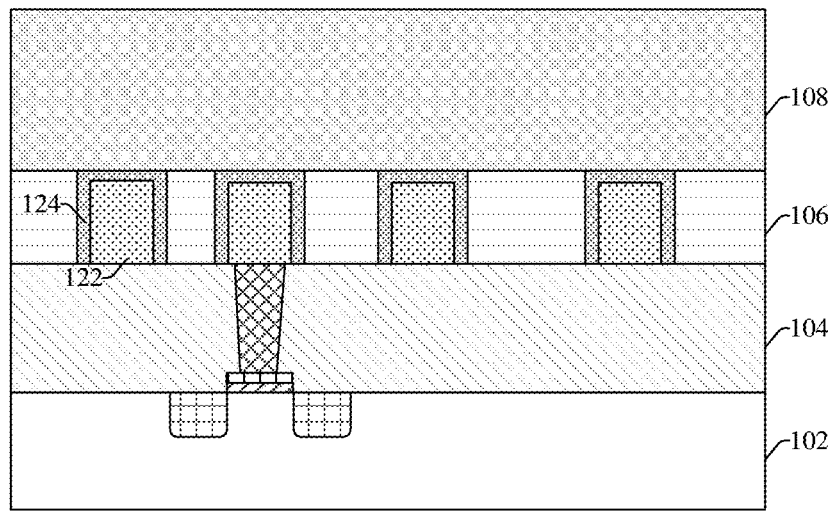

As shown in cross-sectional view 900 of FIG. 9, a third ILD layer 108 is deposited over the plurality of self-assembled dielectric liners 124 and over the second ILD layer 106. In some embodiments, the third ILD layer 108 may, for example, be formed by CVD, ALD, a spin coating, or another suitable deposition or growth process. In further embodiments, an etch rate of the third ILD layer 108 is five times faster or more than the etch rate of the second ILD layer 106 and the etch rate of the plurality of self-assembled dielectric liners 124 (i.e. second ILD layer 106 and plurality of self-assembled dielectric liners 124 to third ILD layer 108 etch selectivity of 5:1 or greater).

Figure 10A:
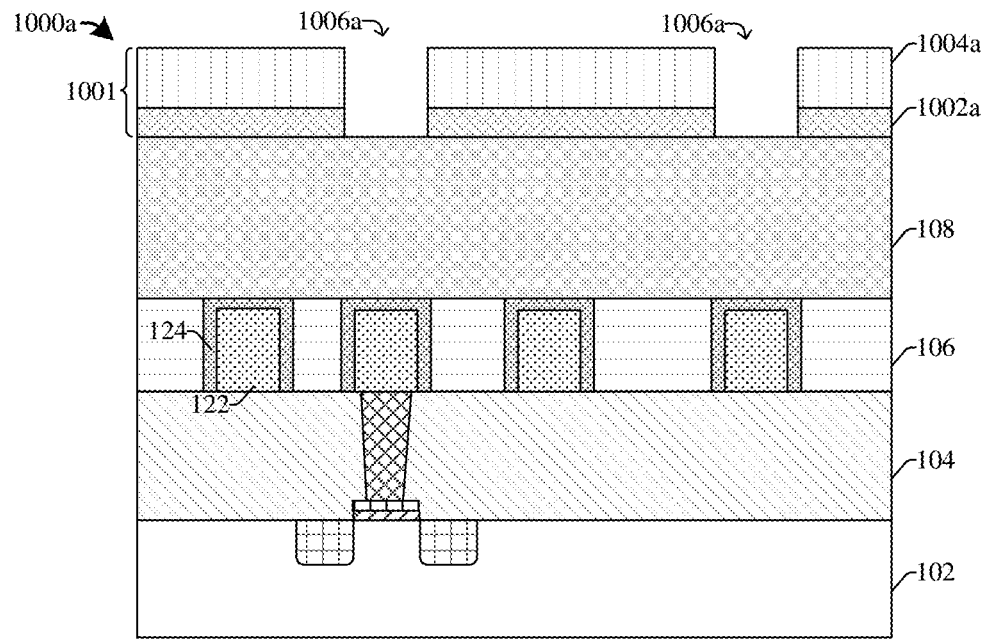
Figure 10B:
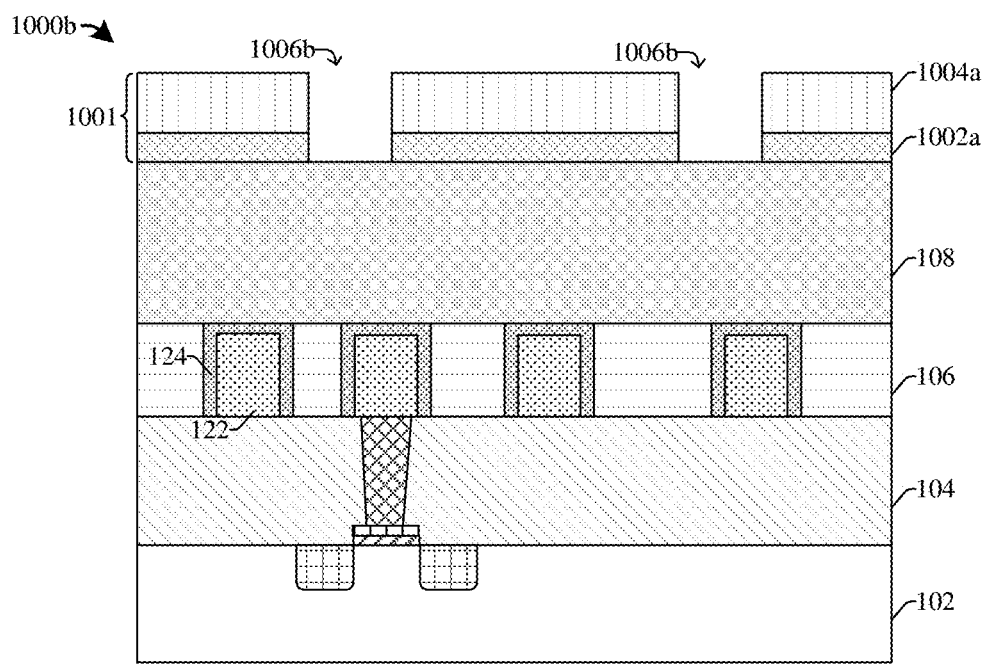

Cross-sectional view 1000a of FIG. 10A, and 1000b of FIG. 10B show further processing steps of cross-sectional views without registration errors and with registration errors respectively.

As shown in cross-sectional views 1000a-1000b of FIGS. 10A-10B, a masking layer 1001 is formed over the third ILD layer 108. In some embodiments, the masking layer 1001 may comprise a hard mask layer 1002a deposited over the third ILD layer 108. In some embodiments, a photo resist layer 1004a may be used to pattern the hard mask layer 1002a. The hard mask layer 1002a and photo resist layer 1004a can be formed by CVD, PVD, or an ALD process. The masking layer 1001 has sidewalls defining openings 1006a that expose an upper surface of the third ILD layer 108. In some embodiments, shown in cross-sectional view 1000a of FIG. 10A, the openings 1006a laterally straddle a sidewall of an underlying one of the plurality of conductive wires 122. In other embodiments, shown in cross-sectional view 1000b of FIG. 10B, openings 1006b are completely confined above an underlying conductive wire 122 so that the opening 1006b do not laterally straddle a sidewall of an underlying one of the plurality of conductive wires 122.

Figure 11A:
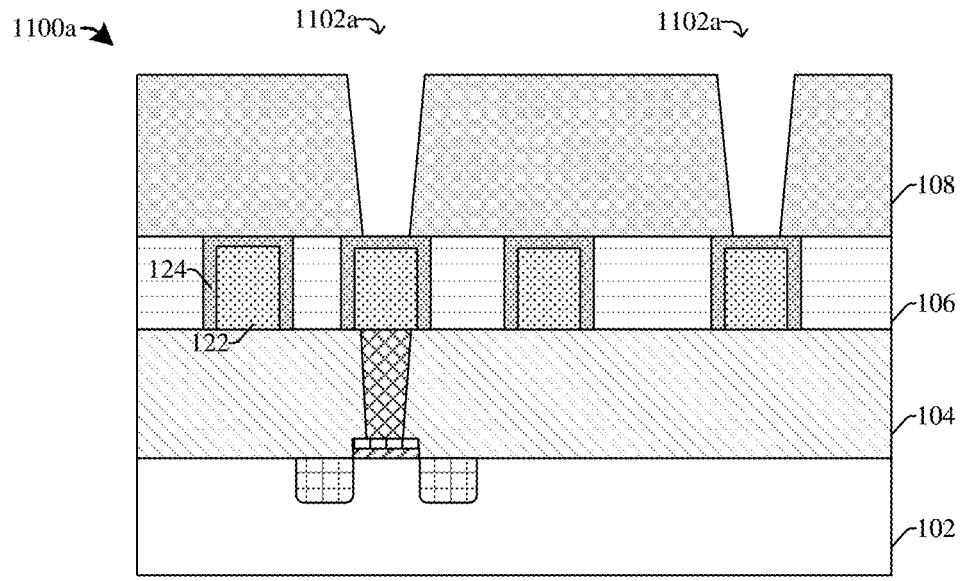
Figure 11B:
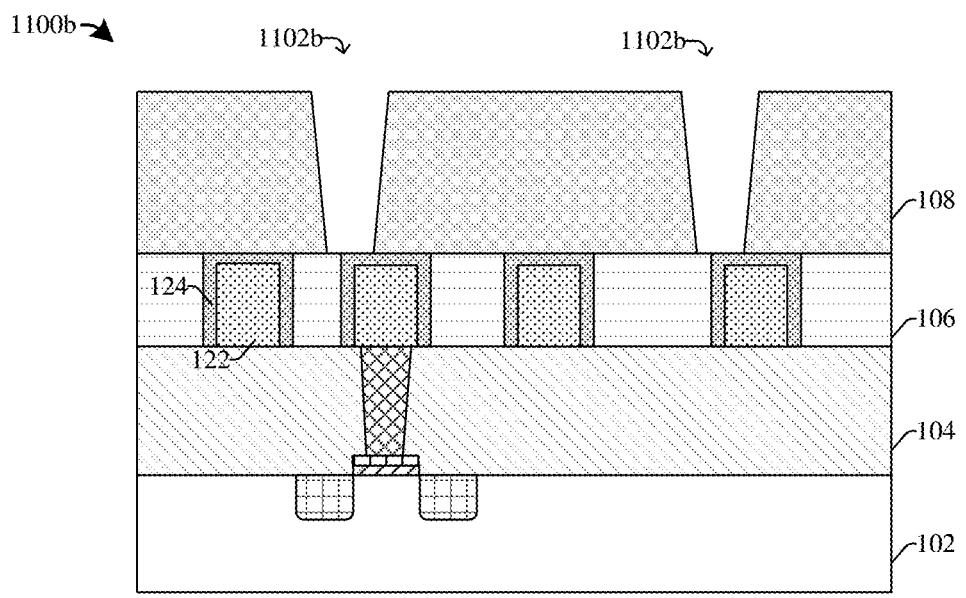

As shown in cross-sectional view 1100a of FIG. 11A and cross-sectional view 1100b of FIG. 11B the third ILD layer 108 is etched according to the masking layer (1001 of FIGS. 10A-10B) to define via openings 1102a and 1102b without registration errors and with registration errors respectively. The via openings 1102a. 1102b extend through the third ILD layer 108 to a top surface of the plurality of self-assembled dielectric liners 124 and the second ILD layer 106. In some embodiments, the third ILD layer 108 may, for example, be etched with a capacitively coupled plasma RIE (CCP RIE) process. In some such embodiments, the CCP RIE process may use a power supply at 100 to 2000 watts, or below 300 watts, or other suitable values. In further embodiments, the CCP RIE process includes ionization of electrons in a gas, the gas may include tetrafluoromethane (CF4), fluoroform (CHF3), methyl fluoride (CH3F), difluoromethane (CH2F2), octafluorocyclobutane (C4F8), hexafluoro butadiene (C4F6), dinitrogen (N2), dihydrogen (H2), dioxygen (O2), argon (Ar), or another gas or combination of gasses. After etching of the third ILD layer 108, the masking layer (1001 of FIG. 10A-10B) can be removed by way of an etching process, a plasma process, a planarization process, or the like.

Figure 12A:
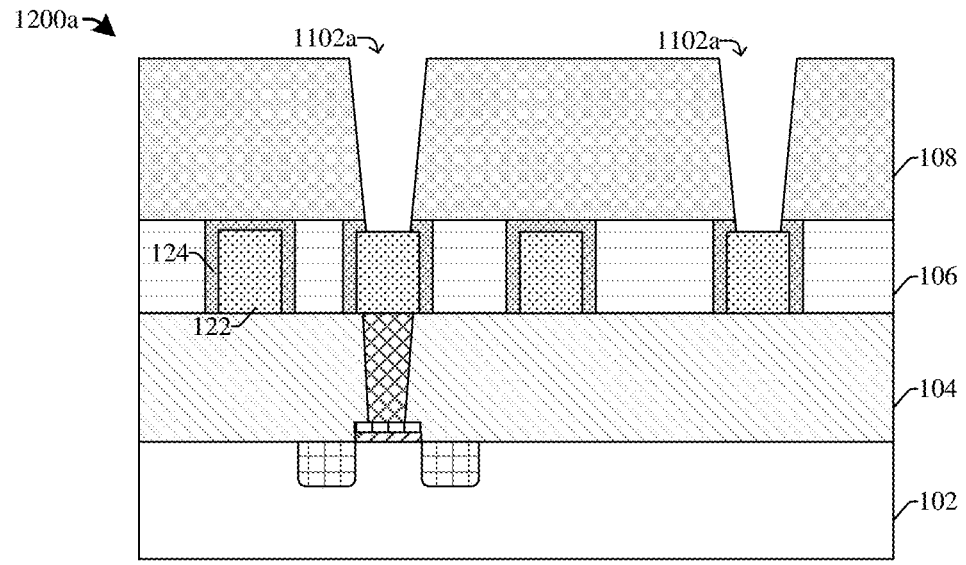
Figure 12B:
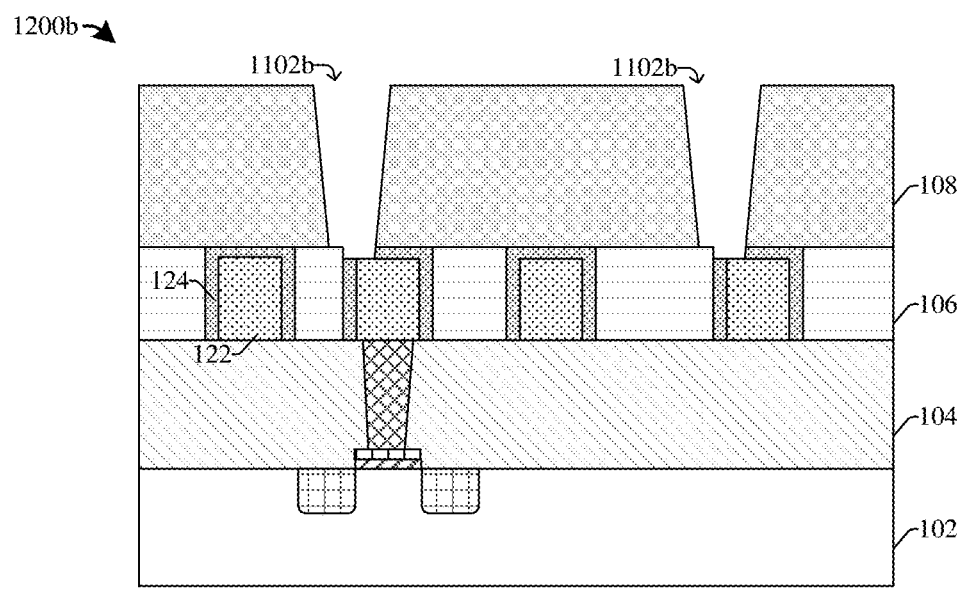

As shown in cross-sectional view 1200a of FIG. 12A and cross-sectional view 1200b of FIG. 12B parts of the plurality of self-assembled dielectric liners 124 are removed to expose the plurality of conductive wires 122. In cross-sectional view 1200a, one or more of the plurality of self-assembled dielectric liners 124 are removed such that sidewalls of one or more of the plurality of self-assembled dielectric liners 124 are exposed, and an uppermost surface of one or more of the plurality of conductive wires 122 is exposed. In cross-sectional view 1200b, one or more of the plurality of self-assembled dielectric liners 124 are removed such that a sidewall and a top surface of one or more of the plurality of self-assembled dielectric liners 124 are exposed, and an uppermost surface of one or more of the plurality of conductive wires 122 are exposed, and a sidewall and top surface of the second ILD layer 106 is exposed.

In some embodiments one or more of the plurality of self-assembled dielectric liners 124 may, for example, be removed with a CCP RIE process with a power supply at 500 to 1000 watts, or at 100 to 300 watts, or other suitable values. In further embodiments, the CCP RIE process includes ionization of electrons in a gas, the gas may include dinitrogen (N2), dihydrogen (H2), dioxygen (O2), Argon (Ar), and helium (He) or the like. Additionally, in some embodiments, the CCP RIE process may, for example, be removed by a wet etch process.

Figure 13A:
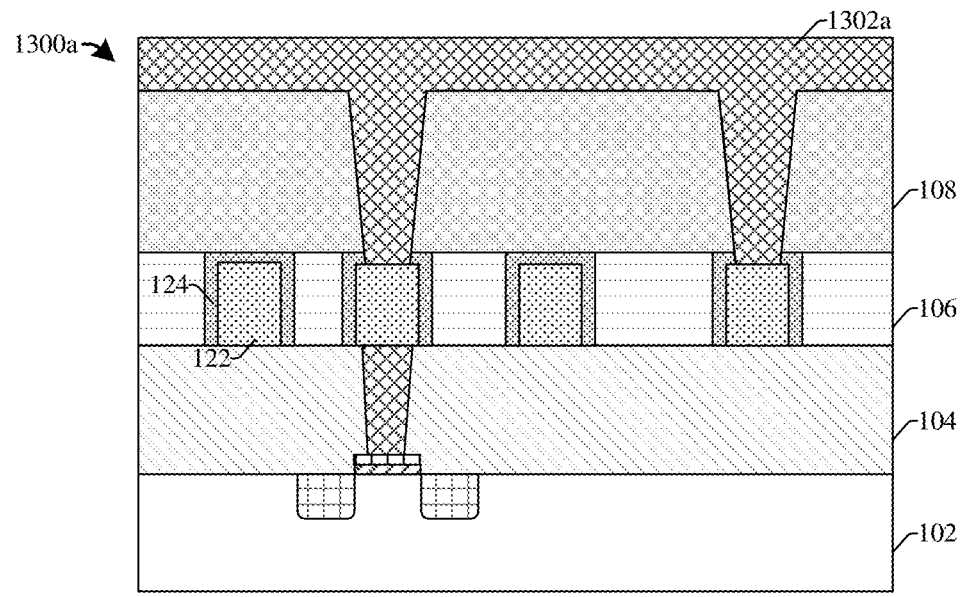
Figure 13B:
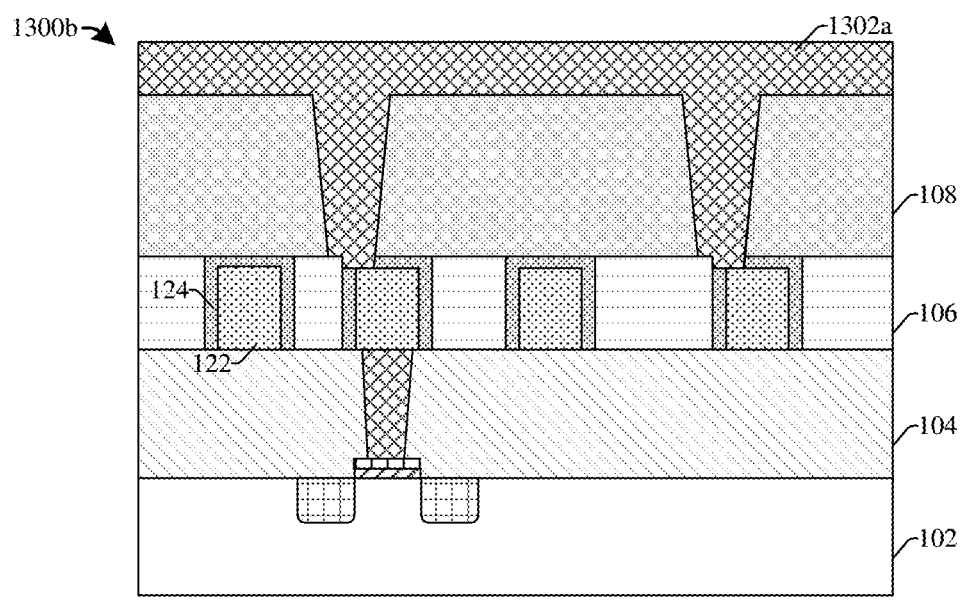

As shown in cross-sectional view 1300a of FIGS. 13A and 1300b of FIG. 13B a conductive material 1302a is deposited over the plurality of self-assembled dielectric liners 124, plurality of conductive wires 122, second ILD layer 106 and third ILD layer 108, such that the conductive material 1302a fills the via openings 1102a, 1102b. In some embodiments, the conductive material 1302a may, for example, be deposited by CVD, PVD, electroless plating, electro plating, sputtering, or another suitable deposition or growth process.

Figure 14A:
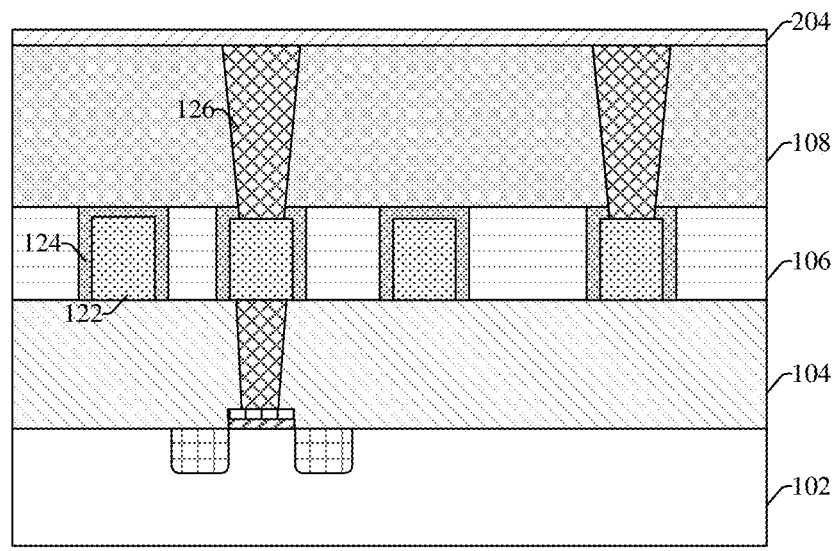
Figure 14B:
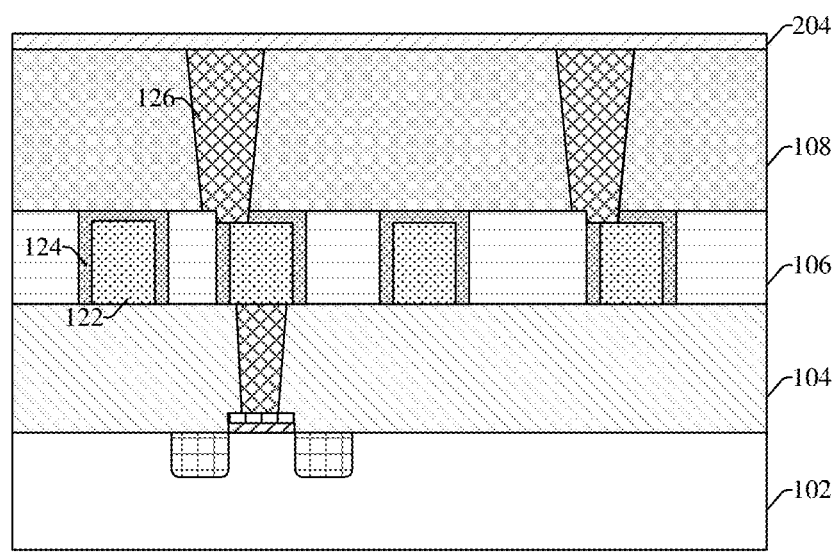

As shown in cross-sectional view 1400a of FIG. 14A, and 1400b of FIG. 14B, a planarization process (e.g., a CMP process) is performed into the conductive material 1302a, thereby defining one or more second conductive vias 126. The one or more second conductive vias 126 are disposed within the third ILD layer 108 and extend from a top surface of the third ILD layer 108 to below a bottom surface of the third ILD layer 108 and below the top surface of the second ILD layer 106. In some embodiments, an etch stop layer 204 may be deposited above the one or more second conductive vias 126 and the third ILD layer 108.

The one or more second conductive vias 126 in cross-sectional view 1400a are electrically coupled to one or more of the plurality of conductive wires 122 without a substantial registration error. The one or more second conductive vias 126 are of a trapezoidal shape where a top width of a top surface of the one or more second conductive vias 126 is greater than a bottom width of a bottom surface of the one or more second conductive vias 126. Furthermore, a bottom surface of the one or more second conductive vias 126 is laterally between outermost edges of one or more of the plurality of conductive wires 122 and between outermost edges of one or more of the plurality of self-assembled dielectric liners 124.

The one or more second conductive vias 126 in cross-sectional view 1400b are electrically coupled to one or more of the plurality of conductive wires 122 with a registration error. The one or more second conductive vias 126 have a first and second lower surface, creating a stair step pattern from the top surface of the second ILD layer 106 to a top surface of one or more of the plurality of conductive wires 210a. The first lower surface of the one or more second conductive vias 126 overlies the top surface of the second ILD layer 106 and the second lower surface of the one or more second conductive vias 126 overlies the top surface of the one or more plurality of conductive wires 122. The second lower surface of the one or more second conductive vias 126 also overlies an upper surface of the one or more plurality of self-assembled dielectric liners 124. A first sidewall of the one or more second conductive vias 126 is arranged along a sidewall of the one or more plurality of self-assembled dielectric liners 124 between the top surface of the one or more plurality of conductive wires 122 and the third ILD layer 108. A second sidewall of the one or more second conductive vias 126 is arranged along a sidewall of the second ILD layer 106.

Figure 15:
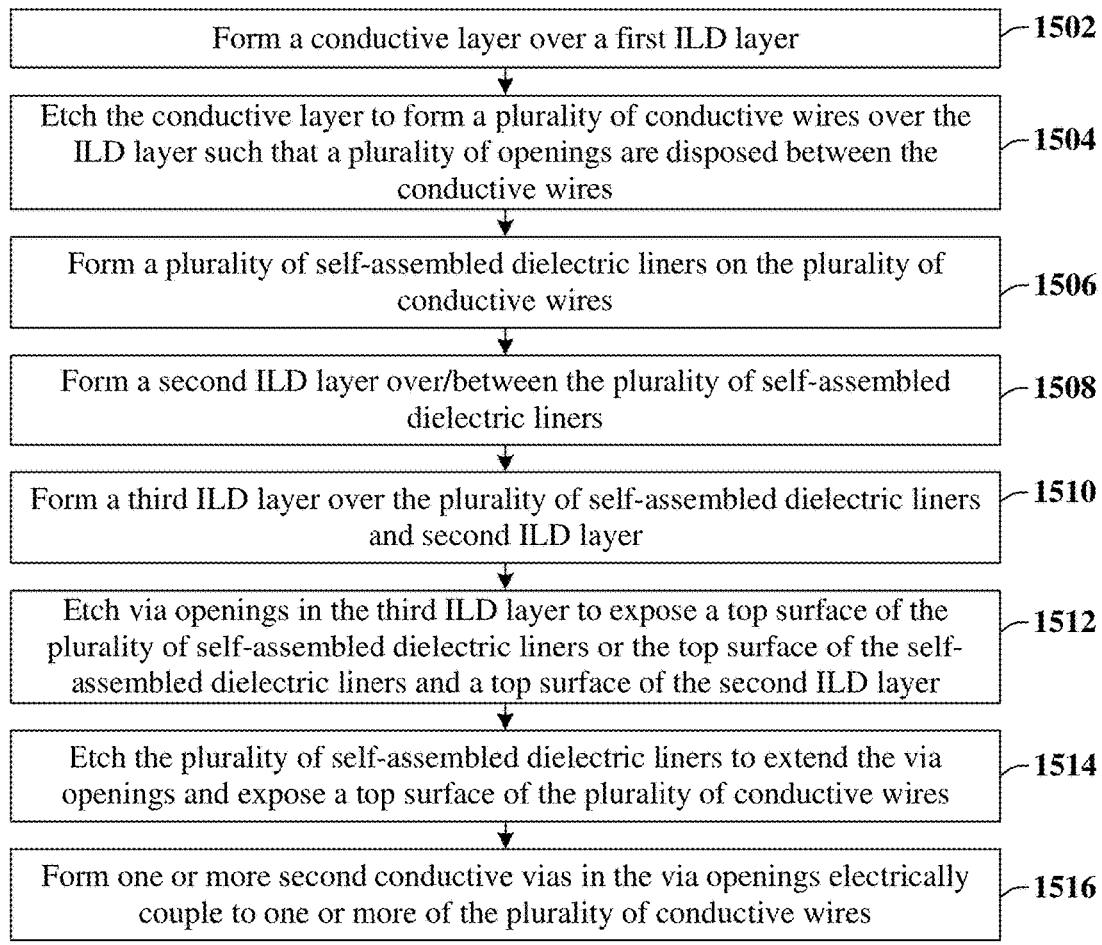
FIG. 15 illustrates a flow diagram of some embodiments of a method of forming an integrated chip having a plurality of self-assembled dielectric liners overlying a plurality of conductive wires disposed within a second ILD layer with one or more second conductive vias electrically coupled to the one or more plurality of conductive wires.

FIG. 15 illustrates a flow diagram of some embodiments of a method 1500 of forming an integrated chip having a plurality of self-assembled dielectric liners 124 overlying a plurality of conductive wires 122 disposed within a second ILD layer 106 with one or more second conductive vias 126 electrically coupled to the one or more plurality of conductive wires 122. Although the method 1500 is illustrated and/or described as a series of acts or events, it will be appreciated that the method 1500 is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1502, a conductive layer is formed over a first ILD layer. FIG. 3 illustrates a cross-sectional view 300 corresponding to some embodiments of act 1502.

At act 1504, the conductive layer is etched to form a plurality of conductive wires over the ILD layer such that a plurality of openings are disposed between the conductive wires. FIGS. 3 through 5 illustrate cross-sectional views 300 through 500 corresponding to some embodiments of act 1504.

At act 1506, a plurality of self-assembled dielectric liners are formed on the plurality of conductive wires. FIG. 6 illustrates cross-sectional view 600 corresponding to some embodiments of act 1506.

At act 1508, a second ILD layer is formed over and between the plurality of self-assembled dielectric liners. FIGS. 7 and 8 illustrate cross-sectional views 700 and 800 corresponding to some embodiments of act 1508.

At act 1510, a third ILD layer is formed over the plurality of self-assembled dielectric liners and second ILD layer. FIG. 9 illustrates cross-sectional view 900 corresponding to some embodiments of act 1510.

At act 1512, via openings are etched in the third ILD layer to expose an upper surface of the plurality of self-assembled dielectric liners or to expose the upper surface of the self-assembled dielectric liners and an upper surface of the second ILD layer. FIGS. 10A and 10B illustrate cross-sectional views 1000a and 1000b corresponding to some embodiments of act 1512. FIGS. 11A and 11B illustrate cross-sectional views 1100a and 1100b corresponding to some alternative embodiments of act 1512.

At act 1514, the plurality of self-assembled dielectric liners are etched to extend the via openings and expose a top surface of the plurality of conductive wires. FIG. 12A illustrates a cross-sectional view 1200a corresponding to some embodiments of act 1514. FIG. 12B illustrates a cross-sectional view 1200b corresponding to some alternative embodiments of act 1514.

At act 1516, one or more second conductive vias are formed in the via openings such that the one or more second conductive vias electrically couple to one or more of the plurality of conductive wires. FIGS. 13A and 14A illustrate cross-sectional views 1300a and 1400a corresponding to some embodiments of act 1516. FIGS. 13B and 14B illustrate cross-sectional views 1300b and 1400b corresponding to some embodiments of act 1516.

Accordingly, in some embodiments, the present disclosure relates to an integrated chip having ICs a self-assembled dielectric disposed on conductive features and configured to reduce registration errors (e.g., overlay errors) between adjacent conductive features. Although FIGS. 1 through 15 describe the plurality of self-assembled dielectric liners 124 as being formed along surfaces of the plurality of conductive wires 122, it is appreciated that the plurality of self-assembled dielectric liners 124 could be formed along the surface of various interconnects, for example wires, vias, and the like.

In various embodiments, the present application provides a semiconductor structure including a first conductive wire disposed over a substrate; a dielectric liner arranged along sidewalls and an upper surface of the first conductive wire and laterally surrounded by a first dielectric layer, the dielectric liner and the first dielectric layer being different materials; and a conductive via disposed within a second dielectric layer over the first conductive wire, the conductive via having a first lower surface disposed over the first dielectric layer and a second lower surface below the first lower surface and over the first conductive wire.

In various embodiments, the present application provides an integrated chip including a first interconnect over a substrate; a dielectric liner covering sidewalls and an upper surface of the first interconnect; a first dielectric layer laterally surrounding the first interconnect; and a second interconnect disposed within a second dielectric layer over the first dielectric layer, the first interconnect vertically extending through the dielectric liner to the second interconnect.

In various embodiments, the present application provides a method of forming a semiconductor device, including forming a first inter-level dielectric (ILD) layer over a substrate; forming a conductive layer over the first ILD layer; patterning the conductive layer to define a conductive wire; selectively depositing a dielectric liner onto sidewalls and an upper surface of the conductive wire; forming a first dielectric layer to laterally surround the dielectric liner and conductive wire; forming a second dielectric layer above the first dielectric layer; etching the second dielectric and etching the dielectric liner to define a via opening; and forming a conductive via in the via opening over the conductive wire.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
   a first conductive wire disposed over a substrate;
   a dielectric liner arranged along sidewalls and an upper surface of the first conductive wire and laterally surrounded by a first dielectric layer, wherein the dielectric liner and the first dielectric layer are different materials; and
   a conductive via disposed within a second dielectric layer over the first conductive wire, wherein the conductive via has a first lower surface disposed over the first dielectric layer and a second lower surface below the first lower surface and over the first conductive wire.

2. The semiconductor structure of claim 1, wherein the conductive via extends through the dielectric liner and has a bottommost surface that is laterally between outermost edges of the first conductive wire and between outermost edges of the dielectric liner.

3. The semiconductor structure of claim 1, wherein the second lower surface of the conductive via is laterally outside of a top of the first conductive wire.

4. The semiconductor structure of claim 1, wherein the second lower surface contacts the first conductive wire.

5. The semiconductor structure of claim 1, wherein the conductive via has a sidewall arranged between the first lower surface and the second lower surface.

6. The semiconductor structure of claim 1, wherein the dielectric liner contacts an outer sidewall of the conductive via.

7. The semiconductor structure of claim 1, wherein the dielectric liner is between a topmost surface of the first conductive wire and a bottommost surface of the second dielectric layer.

8. The semiconductor structure of claim 1, wherein the dielectric liner comprises silicon and one or more of carbon, oxygen, or nitrogen.

9. An integrated chip comprising:
   a first interconnect over a substrate;
   a dielectric liner covering sidewalls and an upper surface of the first interconnect;
   a first dielectric layer laterally surrounding the first interconnect; and
   a second interconnect disposed within a second dielectric layer over the first dielectric layer, wherein the second interconnect has a first lower surface disposed on the first dielectric layer, and a second lower surface below the first lower surface, the second lower surface disposed on the dielectric liner.

10. The integrated chip of claim 9, wherein an upper surface of the first interconnect is at a common elevation with the second lower surface.

11. The integrated chip of claim 9, wherein the dielectric liner continuously extends from below a bottommost surface of the second interconnect to above the bottommost surface of the second interconnect.

12. The integrated chip of claim 9, wherein the second interconnect has a first sidewall and an opposing second sidewall as viewed in a cross-sectional view, the first sidewall extending below a bottom of the second sidewall.

13. The integrated chip of claim 9, wherein the second interconnect laterally extends from along a sidewall of the dielectric liner, to over a top surface of the first interconnect, over an upper surface of the dielectric liner, and over a top surface of the first dielectric layer.

14. The integrated chip of claim 9, wherein the dielectric liner is arranged along outermost sidewalls of the first interconnect, a top surface of the first interconnect, and sidewalls of the second interconnect.

15. The integrated chip of claim 9, further comprising:
   an inter-level dielectric (ILD) layer separating the first interconnect from the substrate; and
   wherein the dielectric liner extends from a top surface of the ILD layer to a bottom surface of the second dielectric layer, the dielectric liner covering a top surface of the first interconnect such that the first interconnect is separated from the second dielectric layer by the dielectric liner.

16. The integrated chip of claim 9, wherein a horizontally extending surface of the dielectric liner is above the first interconnect and laterally extends past one or more outer sidewalls of the first interconnect.

17. A semiconductor device comprising:
- a first conductive wire disposed over a substrate;
- a first dielectric layer laterally surrounding the first conductive wire;
- a conductive via disposed within a second dielectric layer over the first conductive wire;
- a dielectric liner disposed between the first conductive wire and the first dielectric layer, wherein the dielectric liner comprises a first surface that meets the conductive via at a location laterally offset from the first conductive wire; and
- the dielectric liner comprises a second surface that extends from a top surface of the first conductive wire to a top surface of the first dielectric layer, and extends along a sidewall of the conductive via.

18. The semiconductor device of claim 17, wherein the conductive via comprises a lower surface that meets the first dielectric layer at a location that is laterally offset from the dielectric liner.

19. The semiconductor device of claim 17, wherein the first dielectric layer is disposed along a sidewall of the conductive via that is opposite of the second surface of the dielectric liner.

20. The semiconductor device of claim 19, wherein the conductive via extends along the first dielectric layer, the dielectric liner, and the first conductive wire.

* * * * *